(12) United States Patent
Cohen et al.

(10) Patent No.: US 7,474,757 B2
(45) Date of Patent: Jan. 6, 2009

(54) CIRCUIT AND METHOD FOR PROVIDING AN AUTO-OFF AND/OR AUTO-ON CAPABILITY FOR AN AUDIO DEVICE

(75) Inventors: Arthur L. Cohen, Mountain View, CA (US); John Glissman, Valley Ford, CA (US)

(73) Assignee: Aerielle Technologies, Inc., Mountain View, CA (US)

( * ) Notice: Subject to any disclaimer, the term of this patent is extended or adjusted under 35 U.S.C. 154(b) by 685 days.

(21) Appl. No.: 10/540,070

(22) PCT Filed: Jan. 9, 2004

(86) PCT No.: PCT/US2004/000452

§ 371 (c)(1),
(2), (4) Date: Jun. 22, 2005

(87) PCT Pub. No.: WO2004/064026

PCT Pub. Date: Jul. 29, 2004

(65) Prior Publication Data

US 2006/0050901 A1    Mar. 9, 2006

Related U.S. Application Data

(60) Provisional application No. 60/438,905, filed on Jan. 9, 2003.

(51) Int. Cl.
*H03F 21/00* (2006.01)
*G10H 1/00* (2006.01)

(52) U.S. Cl. .................. 381/120; 381/111; 327/530

(58) Field of Classification Search ............... 381/120, 381/118, 55, 77, 111–117, 94.5–94.8; 327/4, 327/20, 342, 530, 535, 537; 330/296–7
See application file for complete search history.

(56) References Cited

U.S. PATENT DOCUMENTS

| | | | | |
|---|---|---|---|---|
| 3,914,705 A | * | 10/1975 | Takahashi | 330/283 |
| 4,536,808 A | * | 8/1985 | Fujibayashi | 360/74.2 |
| 4,679,240 A | * | 7/1987 | Heide | 381/321 |
| 5,025,704 A | | 6/1991 | Davis | |
| 5,150,416 A | * | 9/1992 | Hasler | 381/104 |
| 5,636,077 A | | 6/1997 | Kim | |
| 5,771,441 A | | 6/1998 | Altstatt | |
| 6,191,505 B1 | * | 2/2001 | Matsuyama | 307/130 |

(Continued)

*Primary Examiner*—Xu Mei
(74) *Attorney, Agent, or Firm*—Craig M. Stainbrook; Stainbrook & Stainbrook, LLP (57) ABSTRACT

A circuit (FIGS. 2A-2D) and method of providing an auto-on and/or auto-off capability for an audio device, of a type having an audio plug (14) which mates with the output jack of an audio source. The portable transmitter (10) modulates audio signals from the audio source onto a carrier and transmits them to a receiver. The auto-on and auto-off capability is provided to prolong battery life and degradation of the transmitter circuit and comprises pinching off a FET (Q2) when the circuit is in an "off" state. This occurs when a pre-determined threshold in a capacitor is reached by not discharging that capacitor. The capacitor (C29) is discharged by dropping a comparator input below a pre-determined threshold limit when presented with an audio peak and wherein the drop in value causes the comparator output to go low, causing the capacitor to discharge and causing the FET (Q2) to supply power to the regulator.

14 Claims, 5 Drawing Sheets

U.S. PATENT DOCUMENTS 6,441,804 B1 8/2002 Hsien
RE37,884 E 10/2002 Chen
6,529,067 B2 3/2003 Uen et al.
7,120,403 B2 * 10/2006 Cohen et al. .............. 455/127.5
7,200,238 B1 * 4/2007 Shyu et al. ................. 381/94.8

* cited by examiner

CIRCUIT AND METHOD FOR PROVIDING AN AUTO-OFF AND/OR AUTO-ON CAPABILITY FOR AN AUDIO DEVICE

PRIORITY DOCUMENT

The present application claims the benefit of the filing date of U.S. Provisional Patent Application Ser. No. 60/438,905, filed 9 Jan. 2003.

BACKGROUND OF THE INVENTION

1. Technical Field

The present invention relates generally to the field of consumer electronics, and, more specifically, to the field of audio devices such as wireless transmitters or portable audio power amplifiers for use in transmitting a signal from a device such as a CD player, MP3 player, or other portable audio device to a remote speaker system, car stereo or wireless receiver system, and where such device needs to maximize efficiency of available primary power.

2. Background Art

With the widespread use of portable AM/FM receivers, cassette, CD, MP3 players, as well as other consumer electronic devices outputting audio and/or data signals, a need has arisen for more convenient methods for delivering those signals to the system user. Currently, users typically wear headphones that are coupled to the signal-generating device by wires. These wires are inconvenient and possibly dangerous. In the case of portable audio devices, for instance, the devices may be employed while their users are doing other things such as jogging, rollerblading, manual labor, driving, etc. During such activities, wires are susceptible to being tangled up or otherwise providing a hindrance to efficient use. The same is true of wires leading from stationary devices such as a personal computer, car dashboard, or rack mounted stereo. Therefore, as signal generating devices have proliferated, so too has the need to make them convenient. One example of a convenient, hands-free environment was disclosed in U.S. Pat. No. 5,771,441 for a *Small Battery Operated Rf Transmitter for Portable Audio Devices for Use with Headphones with Rf Receiver*, issued Jun. 23, 1998 to John E. Alstatt (hereinafter referred to as "Alstatt").

In Alstatt, there is taught a portable RF transmitter that modulates audio signals from an audio source onto an FM carrier and then transmits such signals to an FM receiver mounted on a headset worn by a user. The RF transmitter uses its own ground circuit and the ground circuit of the audio source as two elements of a short dipole. Products, such as the AUDIOBUG™, available from Aerielle Group International, Inc. of Cupertino, Calif., have successfully embodied such a wireless device.

A further example of a solution to the problem of wireless transmission is found where small RF transmitters have been used on electric guitars to transmit audio signals from the guitar transducer to a receiver coupled to a power amplifier. An example of this type of technology is found in U.S. Pat. No. 5,025,704 for a *Cordless Guitar Transmitter*, issued Jun. 26, 1991 to Richard L. Davis (hereinafter referred to as "Davis"). In Davis, there is taught an electronic device which, when connected to an electric guitar, or other similar stringed instrument, will effect wireless transmission over a selectable frequency of the FM broadcast band. The unit is compact as it uses the metal strings of the guitar as a partial antenna. The unit remains stationary after being plugged into the guitar's input receptacle, and no transmitting portion of the device has to be attached to the musician's belt or guitar strap, or to the musician's person. Furthermore, no antenna extends from the device itself. The device is automatically turned on when plugged in.

As devices providing wireless transmission capabilities have improved and become more convenient and accessible at the consumer level, there has also grown a need to become more efficient in prolonging battery life. Without this efficiency, larger and/or more expensive batteries, or multiple batteries coupled together, are required to drive the transmitters. The alternative has been a drastically reduced battery life. Thus, there has evolved a need for circuits that reduce battery consumption.

Several United States patents reflect proposed solutions to this need, including U.S. Pat. No. 5,636,077, to Kim, which discloses a video recording and reproduction device having an automatic power-saving circuit. The circuit determines the existence of an input video signal and controls system functions accordingly. Video recording and reproduction functions continue if an input video signal is present, and, if no video signal exists and no function key is input for a predetermined period of time, the recording/reproducing actions are halted and power is automatically cut-off.

U.S. Pat. No. 6,441,804, to Hsien, teaches a wireless cursor control system that includes a pointing device and a receiver. The pointing device has a controller for receiving user input and for providing a control signal, and a transmitter that includes an antenna and a high frequency modulator coupled to the controller for receiving the control signal and for generating an output signal for transmission via the antenna. The high frequency modulator includes a variable frequency modulator circuit for selectively changing the frequency deviation of the control signal, and a high frequency circuit for increasing the frequency deviation of the control signal to produce the output signal. The receiver has an antenna that receives the output signal, and a demodulation circuit for demodulating the received output signal. The transmitter circuit includes a power saving circuit coupled to the high frequency modulator and controller and detects whether controller has received any input from a button circuit. If no input has been received by the controller for a predetermined time period, the power saving circuit automatically switches the transmitter into a power-saving mode by disconnecting the RF amplifier and the buffer circuit. In the power-saving mode, the button circuit, clock generator, and controller are on, and the remaining circuits are deactivated. User activation of any of the buttons of the button circuit causes the transmitter to come out of the power-saving mode.

U.S. Pat. No. 6,529,067 to Uen shows a power saving device for a wireless pointer including a first resistor, a second capacitor, a signal generation circuit, a bias control circuit including an n-type channel MOSFET having a drain connected to the signal generation circuit at a second node for driving the signal generation circuit, a switch having one end connected to an n-type channel MOSFET gate at a first node, a semiconductor having an anode connected to the first node gate and a cathode connected to the positive terminal of the power source, and a first capacitor in series connection with the semiconductor means. When the wireless pointer is inoperative, the switch opens automatically to cause the leakage current of the reverse biased semiconductor to charge the first capacitor. When the switch is closed, the first capacitor discharges completely and cuts off the n-type channel MOSFET. The charging and discharging decrease current consumption in a standby mode.

U.S. Pat. No. RE37,884 to Chen discloses a transmitter-receiver system including a transmitter unit installed in an audio equipment, and a receiver unit installed in an earphone, wherein the transmitter unit includes an automatic electric level regulator to regulate the electric level of the output signal of audio equipment to a predetermined range, a power control circuit controlled by the output signal of the audio equipment to provide the necessary working voltage, and an inductance antenna to transmit output signal from the audio equipment to the receiver unit. The receiver unit is of low working voltage design, including an automatic 24-time frequency divider circuit to effectively discriminate left and right sound tracks, and an auto-shut off circuit to automatically cut off power supply when the audio equipment does no work. The transmitter unit and the receiver unit further use a respective dual oscillation frequency regulating circuit consisting of an oscillating transistor, a dielectric resonator, and two variable resistors for regulating the range of the frequency.

The foregoing patents reflect the current state of the art of which the present inventor is aware. Reference to, and discussion of, these patents is intended to aid in discharging Applicant's acknowledged duty of candor in disclosing information that may be relevant to the examination of claims to the present invention. However, it is respectfully submitted that none of the above-indicated patents disclose, teach, suggest, show, or otherwise render obvious, either singly or when considered in combination, the invention described and claimed herein.

DISCLOSURE OF INVENTION

It is therefore an object of the present invention to provide a new and improved circuit with an auto-on capability for an audio device.

It is another object of the present invention to provide a new and improved circuit that also includes a power-saving auto-off capability.

A further object or feature of the present invention is a new and improved circuit and method for providing a combination of auto-off and/or auto-on capabilities for a wireless transmitter.

An even further object of the present invention is to provide a novel circuit having auto-off and/or auto-on capabilities for a wireless transmitter that reduces background noise generated by the circuit.

Accordingly, an aspect of the present invention is the reduction of battery consumption in an audio device by providing an auto-off circuit that will automatically switch off the system when it is not in use. A further aspect of the present invention is reduction of interference, or background noise generated by the system by providing for the use of certain circuit elements. An additional aspect of the present invention is the ability to activate the system by providing an auto-on capability.

Other novel features which are characteristic of the invention, as to organization and method of operation, together with further objects and advantages thereof will be better understood from the following description considered in connection with the accompanying drawings, in which a preferred embodiment of the invention is illustrated by way of example. It is to be expressly understood, however, that the drawings are for illustration and description only and are not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures and elements for the functions specified.

The present invention is a circuit and method for providing an auto-off/auto-on, or auto-on only, capability for an audio device, of a type having an audio plug extending therefrom which mates with the earphone or output jack of an audio source such as a portable battery operated CD, tape, or MP3 player. The portable radio frequency (RF) transmitter modulates audio signals from the audio source onto an RF carrier and transmits them to an RF receiver. The auto-off capability is provided to prolong battery life and degradation of the transmitter circuit and comprises pinching off a first field effect transistor (FET) when the circuit is in an "off" state. This occurs when a pre-determined threshold in a capacitor is reached by not discharging that capacitor. The capacitor is discharged by dropping an audio sensing comparator output when such comparator's sensing input drops below a predetermined threshold limit when presented with an audio peak and wherein the drop in value causes the comparator's open drain or open collector output to go low, discharging the capacitor and causing the field effect transistor (FET) to supply power to the regulator. In a practical application of the circuit, the comparator polarity could be turned around, or reversed, such that it was sensing the positive going peaks to discharge the capacitor.

The auto-on capability is provided to efficiently activate the audio system when in the presence of a stimuli such as an audio signal. The auto-on circuit functions in a similar fashion to the auto-off circuit, and has a low current LED on the housing of the transmitter to indicate that the unit is on. Additionally, the combined auto-on/auto-off circuit is ideally suited for use with a power amplifier (power-amp) that can be used to boost the signal when re-transmitting the signal to one or more remote/additional receivers.

There has thus been broadly outlined the more important features of the invention in order that the detailed description thereof that follows may be better understood, and in order that the present contribution to the art may be better appreciated. There are, of course, additional features of the invention that will be described hereinafter and which will form additional subject matter of the claims appended hereto. Those skilled in the art will appreciate that the conception upon which this disclosure is based may be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the Abstract is to enable the national patent office(s) and the public generally, and especially the scientists, engineers and practitioners in the art who are not familiar with patent or legal terms or phraseology, to determine quickly from a cursory inspection the nature and essence of the technical disclosure of the application. The Abstract is neither intended to define the invention of this application, which is measured by the claims, nor is it intended to be limiting as to the scope of the invention in any way.

Certain terminology and derivations thereof may be used in the following description for convenience in reference only, and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 2 (partitioned into FIGS. 2A-2D for clarity) is a circuit diagram of an audio transmitter having the disclosed auto-off and/or auto-on circuit of this invention.

BEST MODE FOR CARRYING OUT THE INVENTION

Figure 1:
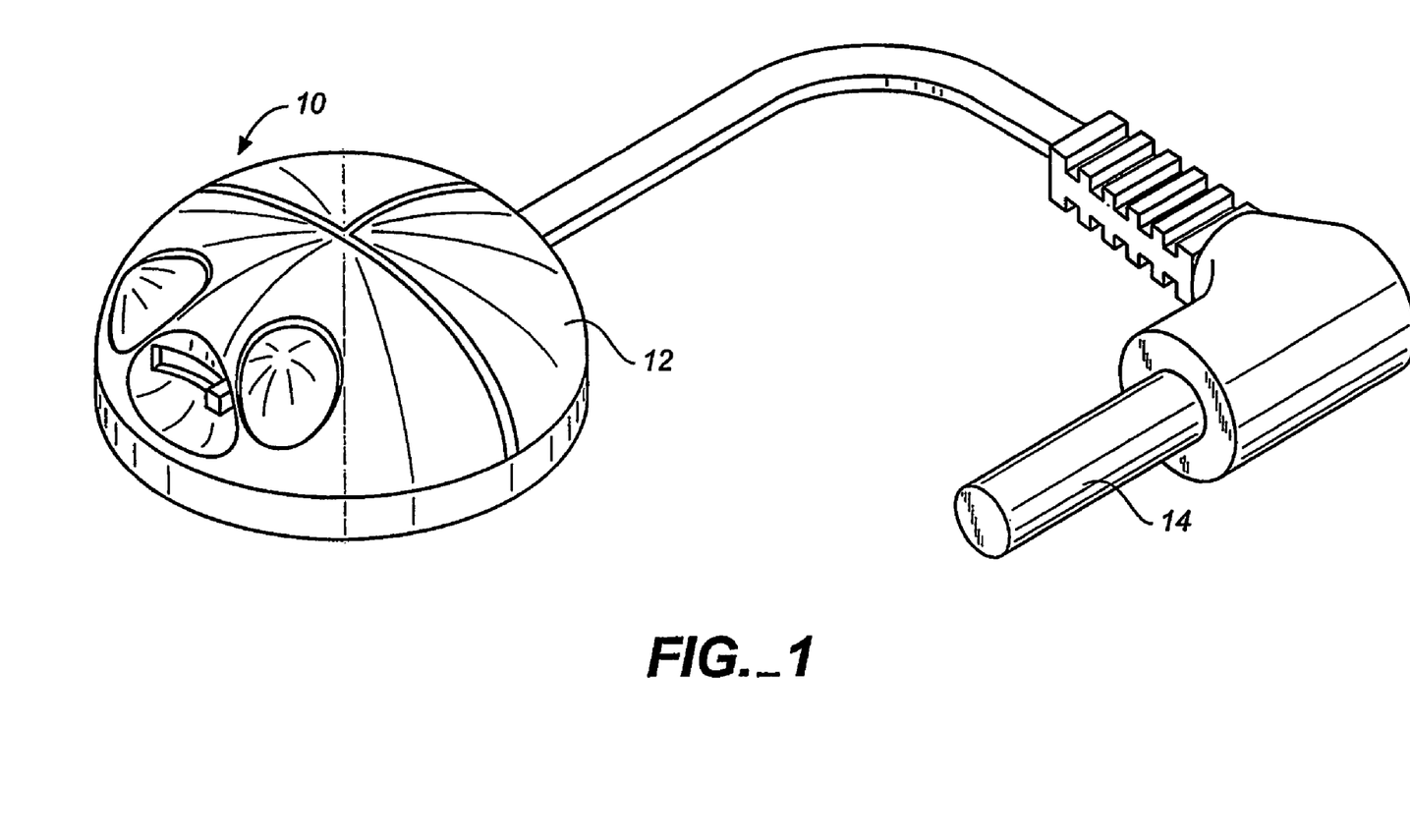
FIG. 1 is a perspective drawing of the supporting structure of a device that can utilize the present invention.

Referring to FIG. 1, there is shown a perspective drawing of the supporting structure or device that can utilize the present invention. A battery operated audio source, typically a portable stereo radio, a portable cassette player or a portable compact disk player, generates audio signals from received radio signals or program material recorded on a medium. These audio signals are presented at a headphone or output jack which in turn are transmitted to the RF transmitter 10.

The portable, battery operated RF transmitter 10, is comprised of a transmitter housing 12 and enclosed integrated circuitry and a male plug 14, which plugs into the headphone or output jack of the audio source. The RF transmitter 10 could alternatively be hardwired to, or embedded in, the device as well. The audio signals generated by the audio source are amplified at the audio transmitter 10 and modulate an RF carrier. The RF carrier is coupled to an antenna for radiation to a remote receiver.

Figures 2, 2A:
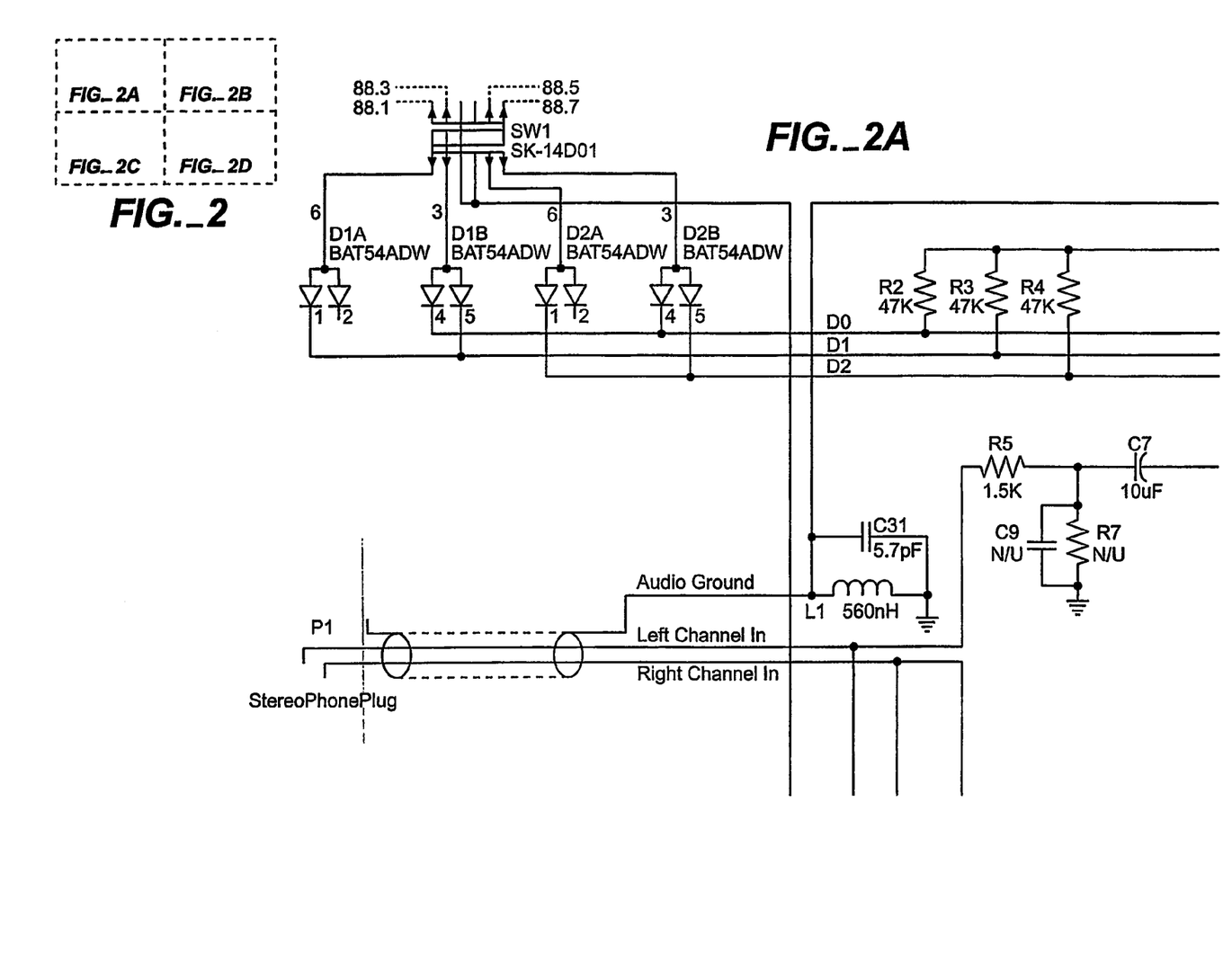
Figure 2B:
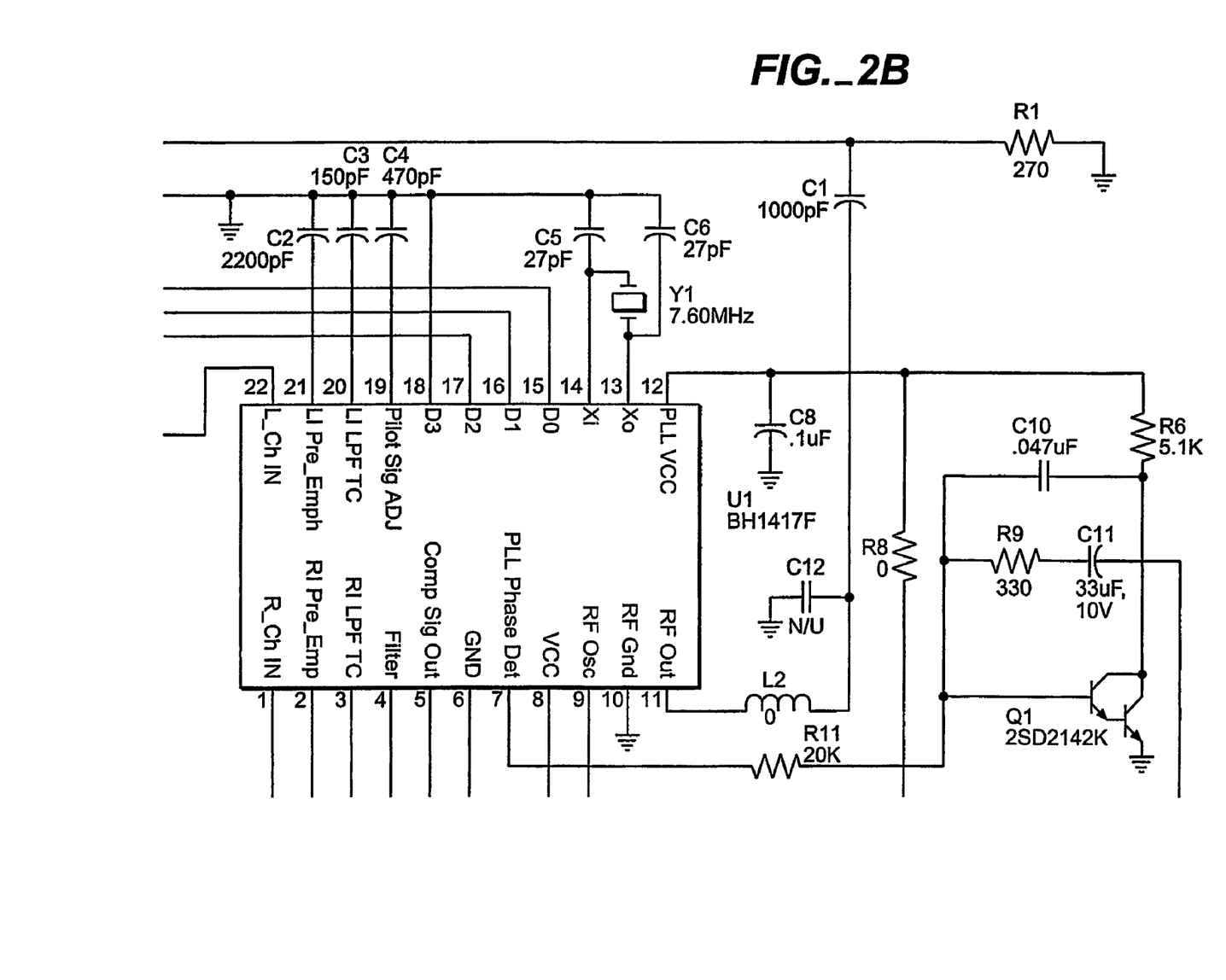
Figure 2C:
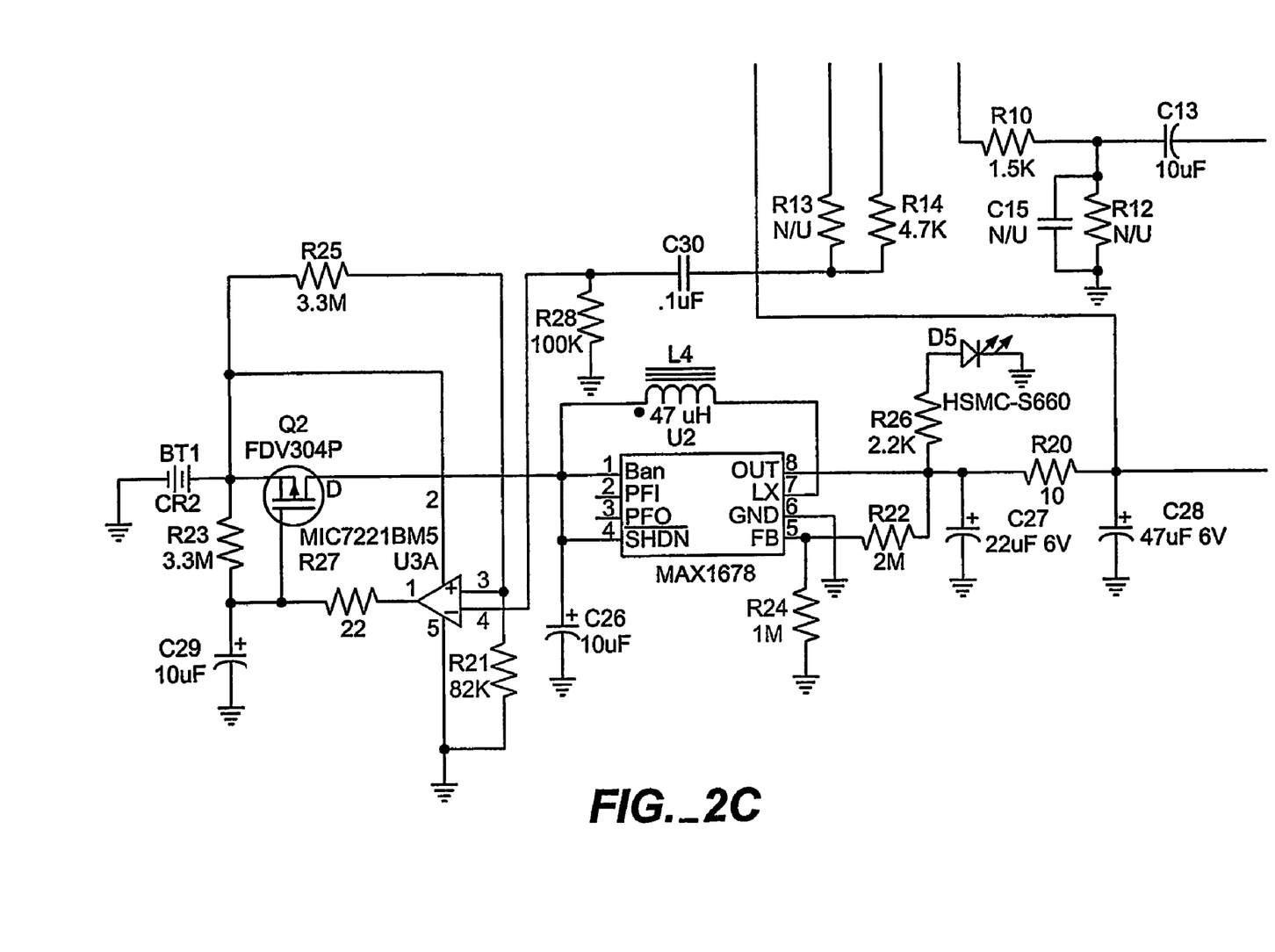
Figure 2D:
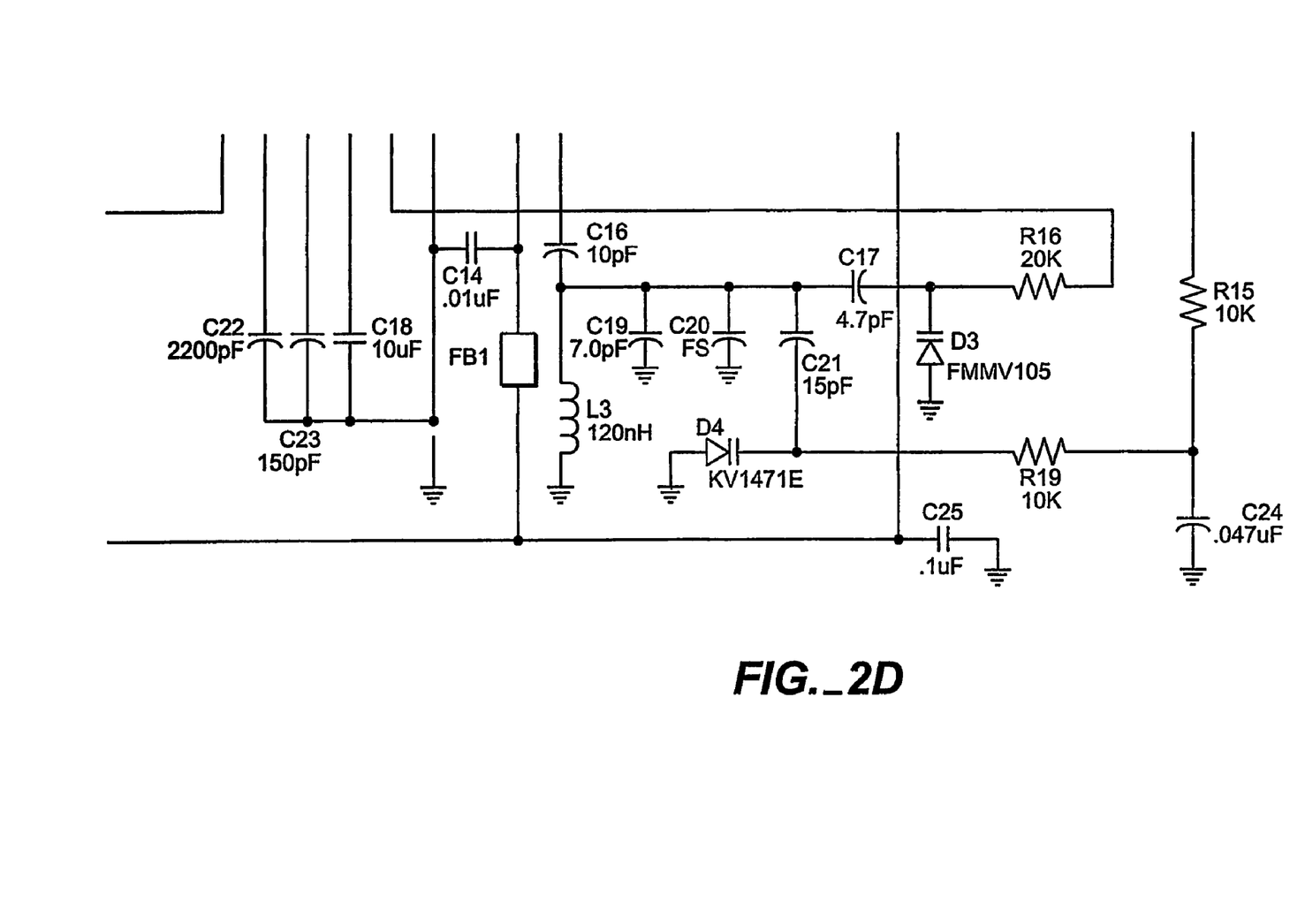

Referring now to FIG. 2 (partitioned into FIGS. 2A-2D for clarity), there is shown a circuit diagram of a transmitter platform which hosts the claimed auto-off/auto-on circuit as used in the preferred embodiment.

Audio signals from an external source such as a CD player, cassette tape player, MP3 player, etc., enter the circuit at P1 via a standard 3.5 mm three conductor audio cable and are attenuated, AC coupled, and routed to the right and left audio input pins (1 and 22). Each channel is routed through a 50 uS pre-emphasis network, a limiter circuit to prevent over-deviation of the transmitter by excessive audio levels, and a 15 kilohertz (KHz) lowpass filter network to remove undesired spectral components outside the audio range. The processed audio signals are then fed to the stereo multiplexer. This circuit does the left-right channel subtraction, modulates a 38 KHz subcarrier provided by the PLL with this signal, and divides the 38 KHz source by two (2) to generate a 19 KHz pilot, and outputs the gain-scaled composite signal on pin 5.

The transmit chain consists of an on-chip phase-locked oscillator with an external AC-coupled tank circuit consisting of L3, C17, C19, C20, C21, and varactor diodes D3 and D4. The oscillator frequency is sampled on-chip and divided by a programmable divider down to approximately 100 KHz, where it is compared with a 100 KHz reference signal derived from a crystal reference oscillator operating at 7.5 MHz. The result of this phase comparison is output from pin 7 to an external loop filter consisting of Q1, C10, C11, C24, R9, and R15, having a bandwidth of about 14 Hz. The DC output of the loop filter is an error voltage proportional to the difference of the divided down oscillator frequency and the divided down reference signal, and is applied to varactor D4, coupled to the oscillator tank circuit by C21, thus controlling the oscillator frequency. Capacitor C20 is selected during manufacture to center the oscillator in the desired range, assuring that frequency lock is maintained over the entire operating voltage and temperature range.

Channel selection is performed by changing the divide ratio of the programmable divider in the oscillator chain. Slide switch SW1, the diode decoding matrix formed by D1 and D2, and the on-chip decoding of signals D0-D3 (pins 15-18) allow the selection of four (4) channels in the range of 88.1 to 107.9 MHz.

The composite stereo baseband signal from pin 5, above, is routed through R16 to varactor diode D3, which is coupled to the oscillator tank circuit by C17. The change in capacitance of this diode caused by the varying composite baseband signal causes small changes in the oscillator frequency, thus frequency modulating the oscillator with the composite signal. Due to the very narrow loop filter bandwidth, the PLL is unable to track out the modulation. A separate varactor diode was used for the modulation path to improve modulation linearity from channel to channel, assuring constant deviation over the operating range.

Primary power for the circuit is provided by a CR2 3V lithium battery. As useful power can be obtained from the battery down to about two (2) volts, and circuit operation is degraded below about 2.8 volts, a switching regulator is used to transform the varying battery voltage to 3.75 volts into the regulator filter. This regulator is a PWM type switcher optimized for efficiency, with the switching frequency varying with battery voltage.

Two important features of the disclosed circuit are the effects of capacitance and "pinch-off." In the circuit as shown, where Q2 is a P-channel field effect transistor (MOSFET), as the drain voltage (VD) within the circuit increases, so does the drain current ($I_D$), up to a certain level-off value. This is true as long as the gate voltage is constant and is not too large. As the gate voltage continues to increase (positively, since this is a P-channel device) a depletion region begins to form on the channel. Charge carriers cannot flow in this region because they must pass through a narrow channel. Ultimately, if the gate voltage becomes high enough, the depletion region will completely obstruct the flow of charge carriers; this is referred to as pinch-off. Capacitance, on the other hand, impedes the flow of alternating current (AC) charge carriers by temporarily storing the energy as an electric field. A capacitor is an electronic component deliberately manufactured to have a specific amount of capacitance which is defined in units such as microfarads ($10^{-6}$F) which are abbreviated μF.

In the auto-off mode, Q2 is pinched off, with the capacitor labeled C29 charged to the battery voltage. Comparator U3, which is always on, senses the presence of audio peaks, which when detected drive the output of U3 low, discharging C29, thus turning on Q2 which supplies power to the regulator. The comparator's non-inverting input is biased around eighty-five (85) mV, while the inverting input is AC coupled to the audio source. Whenever an audio peak (low) drops U3-4 below its eighty-five (85) mV threshold, U3-1 goes low, discharging C29, which has been slowly accumulating a charge through R23. For example, should a period of about seventy (70) seconds go by without any audio pulses discharging C29, it will approach the battery voltage, pinching off Q2. With the input supply cut off, the regulator output drops to zero (0) volts. In this mode, battery drain is about five (5) microamperes.

The auto-on circuit functions in a similar fashion to the auto-off circuit, and preferably has a low current LED on the housing 12 of the transmitter 10 to indicate that the unit is on.

Comparator U3 is powered directly off the battery, so it is on all the time. Current drain, in the off-state, is approximately 5 microamperes. As the normal on-current with a new battery is about 22 milliamperes, this means that the unit, sitting on a shelf unused for one hundred eighty-three (183) days, would consume as much battery power as the unit consumes during one (1) hour of operation. With a representative battery life of about forty (40) hours in the preferred embodiment, the off-state current has virtually no effect on battery life.

The positive input to the comparator is biased for a threshold of about 85 millivolts via R21 and R25. In the off-state, capacitor C29 has charged up to the battery voltage through R23, holding the gate of FET Q2 at the battery voltage thus pinching off the current path to U2-1. The inverting input of the comparator is at zero (0) volts, keeping the output on U3-1 essentially open due to the open drain output. In this mode, the trickle current paths are the quiescent current of U3, the bias divider of R25 and R21, and the leakage current of capacitor C29.

When the transmitter 10 is connected to an active audio source, R14 and C30 conduct a sample of the audio to U3-4, the inverting input of the comparator. R28 provides a discharge path to prevent the build-up of a bias across C30 due to leakage currents from the comparator input. When the audio signal exceeds the voltage on U3-3, the comparator output swings low, discharging capacitor C29 through R27, a current limiting resistor. When C29 discharges, the gate of Q2 drops below its pinch-off threshold, turning the device on and supplying current to the regulator U2. The device is now on.

Capacitor C29 will be slowly charged through R23, but rapidly discharged by U3 whenever the audio signal swings above the comparator threshold. Current values define a power-off time of just over thirty (30) seconds, that is, if the audio source is quiet for more than about thirty (30) seconds, the device will shut off.

In a practical application of the circuit, the comparator polarity could be turned around, or reversed, such that it was sensing the positive going peaks to discharge the capacitor. Practical application of this circuit has been made possible by the recent availability of ultra low-power, low voltage comparators. Among the devices identified to work in this application are the National Semiconductor LMC7221, the Micrel MIC7221, Maxim's MAX986, MAX990, MAX994, and TI's TLC372, TLV1391, and TLV3401.

The LED used is a very low current, high intensity device made by Hewlett-Packard. Biasing this device with a forward current of 600-800 microamperes, provides more than adequate intensity; whereas, a conventional LED would be biased in the 10-20 millampere range for a similar intensity.

Another improvement implemented in this design is the addition of C31 in parallel with L1. The value of C31 was selected to parallel resonate L1 at 89 MHz, providing a significantly higher impedance path to ground for the transmitter RF output coupled to the audio cable shield. Additionally, the combined auto-on/auto-off circuit is ideally suited for use with a power amplifier (power-amp) that can be used to boost the signal when re-transmitting the signal to one or more remote/additional receivers. The power amplifier, also called a "final amplifier" as it relates to the several stages of RF or general signal amplification, boosts the signal strength to the level necessary for reception.

While certain embodiments have been described above in terms of the system within which utilization may occur and/or reside, the invention is not limited to such context. The system shown in FIG. 1 is but one example of a host system for the invention, and the system elements are intended merely to exemplify the type of peripherals and components that can be used in support of the invention.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

The foregoing disclosure is sufficient to enable one having skill in the art to practice the invention without undue experimentation, and provides the best mode of practicing the invention presently contemplated by the inventor. While there is provided herein a full and complete disclosure of the preferred embodiments of this invention, it is not intended to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Accordingly, the proper scope of the present invention should be determined only by the broadest interpretation of the appended claims so as to encompass all such modifications as well as all relationships equivalent to those illustrated in the drawings and described in the specification.

What is claimed as invention is:

1. An auto-on circuit for an audio device, said auto-on circuit comprising:
    a field effect transistor (FET) adapted to pinch off charge carriers when said auto-on circuit is in an "off" state;
    a capacitor connected to said FET and adapted to be charged and discharged, and if not discharged will charge to a pre-determined threshold causing said FET to pinch off; and
    an audio sensing comparator connected to said capacitor and having an open drain output and an input, said input adapted to be dropped in value below a pre-determined threshold limit when presented with an audio peak, and wherein said drop in value causes said output to go low, causing said capacitor to discharge and said FET to supply current to the circuit.

2. The auto-on circuit for an audio device of claim 1 including a wireless transmitter having an audio plug adapted for mating with an output jack of an audio source.

3. The auto-on circuit for an audio device of claim 2 wherein said audio source is selected from the group consisting of a portable stereo radio, cassette player, CD player, and MP3 player.

4. The auto-on circuit for an audio device of claim 1 wherein said capacitor is connected to a battery.

5. The auto-on circuit for an audio device of claim 4 wherein said capacitor is charged to battery voltage when said circuit is in an "off" state.

6. The auto-on circuit for an audio device of claim 4 wherein said capacitor accumulates charge in an absence of audio pulses.

7. The auto-on circuit for an audio device of claim 1 wherein said comparator has a polarity, and said polarity is reversed to sense positive going peaks to discharge said capacitor.

8. The auto-on circuit for an audio device of claim 1 further including a power saving auto-off circuit wherein said comparator input is increased in value to said predetermined threshold limit when audio pulses are not present for a period of time, causing the FET to pinchoff.

9. A method for automatically turning a wireless transmitter for an audio source on or off in response to the presence or absence of audio pulses, said method comprising the steps of:

pinching off charge carriers in a field effect transistor (FET) when the circuit is in an "off" state;

permitting a capacitor to charge to a pre-determined threshold to cause the FET to pinchoff, dropping an audio sensing comparator input in value below a pre-determined threshold limit when presented with an audio peak, wherein said drop in value causes the capacitor to discharge and the FET to supply current to the circuit, and maintaining the comparator input in value above the pre-determined threshold limit when audio pulses are not presented for a period of time.

10. The method of claim 9 further including the step of:
providing an audio plug adapted for mating with an output jack of an audio source.

11. The method of claim 9 further including the step of:
connecting the capacitor to a battery.

12. The method of claim 11 further including the step of:
charging the capacitor to battery voltage when the circuit is in an "off" state.

13. The method of claim 11 further including the step of:
accumulating charge in the capacitor in the absence of audio pulses.

14. The method of claim 9 further including the step of:
reversing the polarity of the comparator to sense positive going peaks to discharge the capacitor.

* * * * *